US008633587B2

(12) United States Patent
Hsu

(10) Patent No.: US 8,633,587 B2
(45) Date of Patent: Jan. 21, 2014

(54) PACKAGE STRUCTURE

(75) Inventor: Shih-Ping Hsu, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 53 days.

(21) Appl. No.: 13/242,169

(22) Filed: Sep. 23, 2011

(65) Prior Publication Data

US 2012/0013002 A1 Jan. 19, 2012

Related U.S. Application Data

(62) Division of application No. 12/535,849, filed on Aug. 5, 2009, now Pat. No. 8,058,721.

(30) Foreign Application Priority Data

Aug. 6, 2008 (TW) ............................... 97129770 A

(51) Int. Cl.
*H01L 23/498* (2006.01)
(52) U.S. Cl.
USPC ................................. 257/737; 257/E23.068

(58) Field of Classification Search
USPC ................... 257/692, E23.174, 737, E23.068
See application file for complete search history.

(56) References Cited

U.S. PATENT DOCUMENTS

| 2007/0076392 A1 | 4/2007 | Urashima et al. |
| 2011/0018099 A1 | 1/2011 | Muramatsu |
| 2011/0024888 A1 | 2/2011 | Pagaila et al. |

*Primary Examiner* — Whitney T Moore
(74) *Attorney, Agent, or Firm* — Edwards Wildman Palmer LLP; Peter F. Corless; Steven M. Jensen

(57) ABSTRACT

Disclosed is a package structure including a semiconductor chip disposed in a core board having a first surface and an opposite second surface. The package structure further includes a plurality of first and second electrode pads disposed on an active surface and an opposite inactive surface of the semiconductor chip respectively, the semiconductor chip having a plurality of through-silicon vias for electrically connecting the first and second electrode pads. As a result, the semiconductor chip is electrically connected to the two sides of the package structure via the through-silicon vias instead of conductive through holes, so as to enhance electrical quality and prevent the inactive surface of the semiconductor chip from occupying wiring layout space of the second surface of the core board to thereby increase wiring layout density and enhance electrical performance.

8 Claims, 5 Drawing Sheets

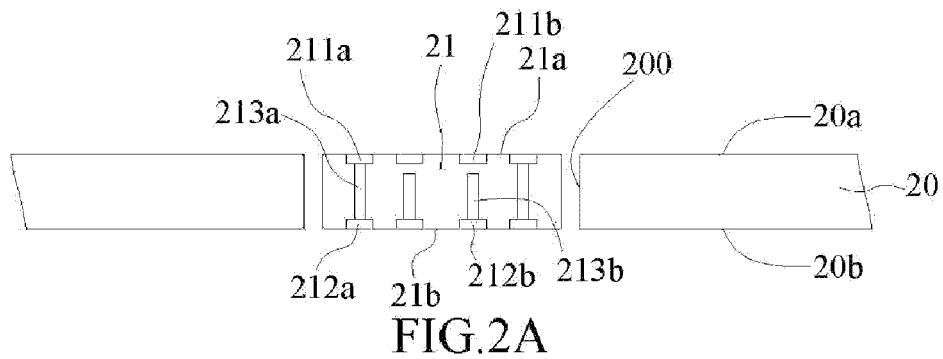
FIG.2A
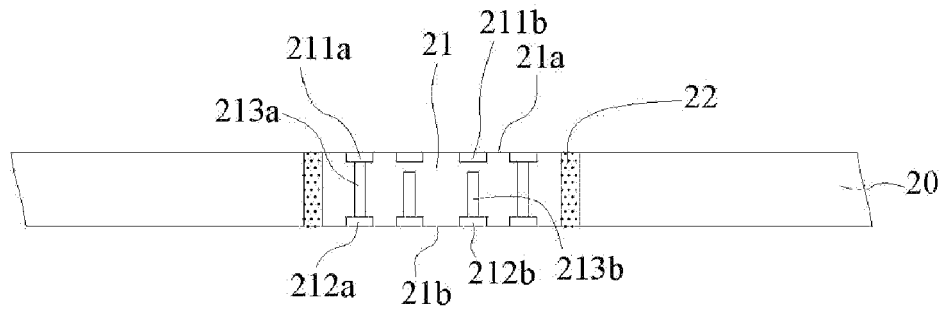
FIG.2B
FIG.2B'
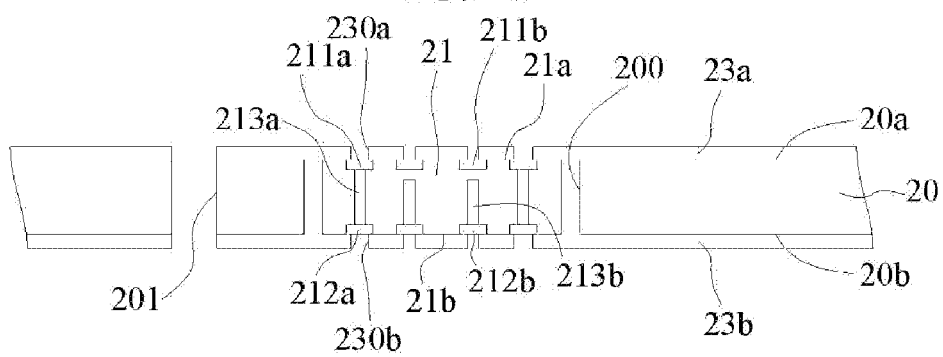
FIG.2C

PACKAGE STRUCTURE

CROSS-REFERENCE TO RELATED APPLICATION(S)

This application is a divisional of copending application U.S. Ser. No. 12/535,849 filed on Aug. 5, 2009.

FIELD OF THE INVENTION

The present invention relates to package structures, and more particularly, to a package structure with an embedded semiconductor chip.

DESCRIPTION OF RELATED ART

As the size of electronics products is trending small, the dimensions of the packaging substrates for carrying semiconductor chips or electronics components are decreasing. There are a variety of semiconductor packages. Ball Grid Array (BGA), for example, is an advanced semiconductor package that allows more I/O connections per unit area of the packaging substrate so as to meet the requirement for high integration of semiconductor chips.

A conventional BGA semiconductor package structure is formed by adhering the inactive surface of the semiconductor chip to the packaging substrate for wire bonding or, alternatively, by flip-chip connecting the active surface of the semiconductor chip to the packaging substrate and then implanting solder balls to the back of the packaging substrate for further electrical connection, thus achieving a high pin number. However, the conventional BGA semiconductor package structure usually fails to enhance electrical properties and electrical performance during high-frequency or high-speed operation because of lengthy paths of wires. In addition, it requires multiple connection interfaces which incur fabrication costs.

Accordingly, to enhance electrical properties effectively and thereby promote marketability of electronic products, a packaging substrate with a semiconductor chip embedded therein for direct electrical connection is developed to shorten electrical conduction paths and to lessen signal loss and distortion, thereby increasing the efficiency of high-speed operation.

FIG. 1 is a cross sectional diagram showing a conventional package structure with an embedded semiconductor chip. There is a second substrate 10b attached to a first substrate 10a, wherein the second substrate 10b has at least one through cavity 100 formed to penetrate the second substrate 10b. A bonding material 110 is disposed in the through cavity 100 so as for a semiconductor chip 11 to be fixed in position to the second substrate 10b. The semiconductor chip 11 has an active surface 11a and an opposing inactive surface 11b. Further, the active surface 11a has a plurality of electrode pads 111, and a built-up structure 12 is provided on the second substrate 10b and the active surface 11a of the semiconductor chip 11 so as to embed the semiconductor chip 11 in a recess constructed via the first and second substrates 10a, 10b. The built-up structure 12 comprises at least one dielectric layer 120, a wiring layer 121 disposed thereon, and a plurality of conductive vias 122 formed in the dielectric layer 120 and electrically connecting with the wiring layer 121, wherein a portion of the conductive vias 122 electrically connect with the electrode pads 111 of the semiconductor chip 11, and the wiring layer 121 is provided with a plurality of conductive pads 123 sufficing electrical connections for other electronics devices (not shown). Moreover, a solder mask 13 is formed on the built-up structure 12, and the solder mask 13 has a plurality of openings 130 formed therein for correspondingly exposing each of the conductive pads 123. As a result, drawbacks caused by lengthy electrical conduction paths are overcome by embedding the semiconductor chip 11 in the through cavity 100.

However, the semiconductor chip 11 is disposed in the second substrate 10b, and the first substrate 10a seals one end of the through cavity 100 so that the inactive surface lib of the semiconductor chip 11 can be disposed on the first substrate 10a. Accordingly, a portion of the wiring layout space of the first substrate 10a and the second substrate 10b is occupied. The wiring layout space of the first substrate 10a and the second substrate 10b is further reduced whenever a large-sized semiconductor chip 11 is embedded in the first substrate 10a and the second substrate 10b using a downsized package structure; hence, in this regard, layout design has never been so difficult. What is more, if the semiconductor chip 11 has to be electrically connected to two edges of the package structure, conductive through holes penetrating the first substrate 10a and the second substrate 10b (not shown) will become necessary, thus lengthening the circuit path to the detriment of electrical quality.

Hence, it is imperative to provide a package structure with an embedded semiconductor chip so as to overcome the above-mentioned drawbacks of the prior art.

SUMMARY OF THE INVENTION

In light of the above drawbacks of the prior art, the present invention provides a package structure to increase wiring layout usage efficiency by preventing the inactive surface of the semiconductor chip from occupying wiring layout space of the substrate and to enhance electrical performance.

The present invention provides a package structure, including: a core board having a first surface and an opposite second surface, and a through cavity penetrating the first and second surfaces; a semiconductor chip disposed in the through cavity and having an active surface and an inactive surface, the active surface and the inactive surface respectively having a plurality of first and second electrode pads, wherein the semiconductor chip has a plurality of through-silicon vias, and a portion of the through-silicon vias penetrates the semiconductor chip for electrically connecting the first and second electrode pads; a first dielectric layer disposed on the first surface of the core board and the active surface; a first wiring layer disposed on the first dielectric layer and having a plurality of first conductive vias penetrating the first dielectric layer so as for the first wiring layer to be electrically connected to the first electrode pads; a second dielectric layer disposed on the second surface of the core board and the inactive surface; and a second wiring layer disposed on the second dielectric layer and having a plurality of second conductive vias penetrating the second dielectric layer so as for the second wiring layer to be electrically connected to the second electrode pads.

The present invention further provides a package structure, comprising: a core board having a first surface and an opposite second surface, and a through cavity penetrating the first and second surfaces; a semiconductor chip disposed in the through cavity and having an active surface and an opposite inactive surface, the active surface and the inactive surface respectively having a plurality of first electrode pads and a plurality of second electrode pads, wherein the semiconductor chip has a plurality of through-silicon vias, and a portion of the through-silicon vias penetrates the semiconductor chip for electrically connecting the first and second electrode pads;

a first dielectric layer disposed on the first surface of the core board and the active surface; a first wiring layer disposed on the first dielectric layer; a second dielectric layer disposed on the second surface of the core board and the inactive surface; a second wiring layer disposed on the second dielectric layer; and a plurality of bumps disposed in the first and second dielectric layers so as for the first and second electrode pads to be electrically connected to the first and second wiring layers, respectively, via the bumps.

According to the aforesaid package structure, the through-silicon vias electrically connect with the second electrode pads, and a portion of the through-silicon vias extend to an interior of the semiconductor chip.

The core board is a wireless substrate, a semi-finished resin layer, a circuit board having circuit traces, or an insulating board. The package structure further comprises a plurality of conductive through holes disposed in the core board, the first dielectric layer and the second dielectric layer for electrically connecting the first and second wiring layers.

The package structure further comprises a first built-up structure provided on the first dielectric layer and the first wiring layer, the first built-up structure comprising at least a third dielectric layer, a third wiring layer disposed on the third dielectric layer, and a plurality of third conductive vias formed in the third dielectric layer for electrically connecting the first wiring layer and the third wiring layer, wherein the outermost third wiring layer has a plurality of third conductive pads. Moreover, the package structure further comprises a first solder mask disposed on the first built-up structure and formed with a plurality of first openings for exposing the third conductive pads, respectively.

Besides, the package structure further comprises a second built-up structure provided on the second dielectric layer and the second wiring layer. The second built-up structure comprises at least a fourth dielectric layer, a fourth wiring layer disposed on the fourth dielectric layer, and a plurality of fourth conductive vias formed in the fourth dielectric layer for electrically connecting the second wiring layer and the fourth wiring layer. The fourth wiring layer has a plurality of fourth conductive pads. The package structure further comprises a second solder mask disposed on the second built-up structure and formed with a plurality of second openings for exposing the fourth conductive pads, respectively.

In summary, the purpose of the package structure disclosed in the present invention is to electrically connect the first electrode pads to the second electrode pads by means of through-silicon vias. As a result, in contrast to prior arts, the semiconductor chip of the present invention is electrically connected to the two sides of the package structure via the through-silicon vias instead of conductive through holes, so as to enhance electrical quality and prevent the inactive surface of the chip from occupying wiring layout space of the second surface of the core board to thereby increase wiring layout density and enhance electrical performance.

BRIEF DESCRIPTION OF DRAWINGS

FIGS. 2A to 2G are cross-sectional diagrams showing a package structure according to an embodiment of the present invention; FIG. 2B' illustrates an alternative embodiment of FIG. 2B.

DETAILED DESCRIPTION OF PREFERRED EMBODIMENTS

Figure 1:
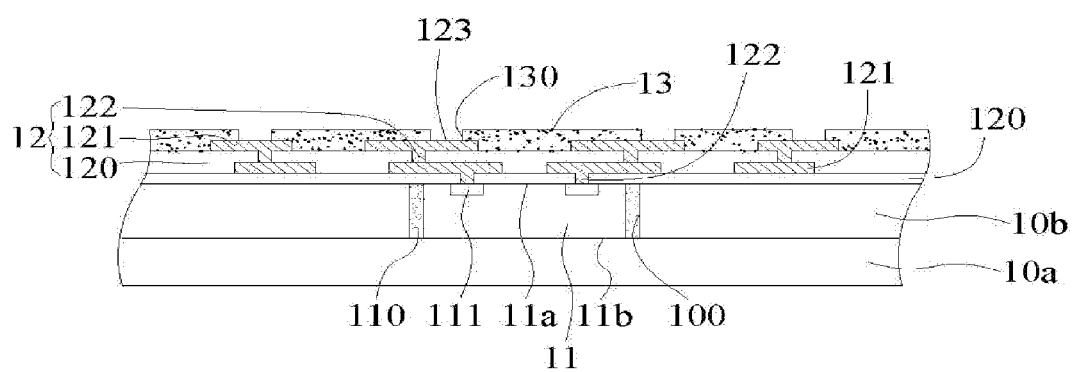
FIG. 1 is a cross section showing a conventional package structure.

The following embodiments are provided to illustrate the disclosure of the present invention, these and other advantages and effects can be apparent to those ordinarily skilled in the art after reading the disclosure of this specification.

FIGS. 2A to 2G are cross-sectional diagrams showing a package structure according to an embodiment of the present invention. As shown in 2A, a core board 20 is provided, which may be a wireless substrate, a semi-finished resin layer, a circuit board having circuit traces, or an insulating board, wherein the semi-finished resin layer refers to a resin layer that has not been fully baked. The core board 20 comprises a first surface 20a, an opposite second surface 20b, and at least a through cavity 200 penetrating the first surface 20a and second surface 20b and receiving a semiconductor chip 21.

The semiconductor chip 21 has an active surface 21a and an opposite inactive surface 21b. The active surface 21a and the inactive surface 21b have a plurality of first electrode pads 211a and 211b and a plurality of second electrode pads 212a and 212b provided thereon, respectively. The semiconductor chip 21 has a plurality of through-silicon vias 213a and 213b (TSV) formed therein.

In the present embodiment, the through-silicon vias 213a connect with the second electrode pads 212b of the inactive surface 21b, and a portion of the through-silicon vias 213a penetrate the semiconductor chip 21 for electrically connecting the first electrode pads 211a on the active surface 21a and the second electrode pads 212a on the inactive surface 21b. Besides, a portion of the through-silicon vias 213b extend to an interior of the semiconductor chip to thereby electrically connect with the internal circuits of the semiconductor chip 21 (not shown).

As shown in FIG. 2B, an adhesive material 22 fills the gap between the through cavity 200 and the semiconductor chip 21 so as for the semiconductor chip 21 to be fixed in position to the through cavity 200. Alternatively, a first dielectric layer 23a is disposed on the first surface 20a of the core board 20 and the active surface 21a of the semiconductor chip 21 while a second dielectric layer 23b is disposed on the second surface 20b of the core board 20 and the inactive surface 21b of the semiconductor chip 21 as shown in FIG. 2B', allowing the first dielectric layer 23a and the second dielectric layer 23b to fill the through cavity 200 so as for the semiconductor chip 21 to be fixed in position to the through cavity 200.

However, descriptions of numerous techniques for a semiconductor chip to be embedded in and fixed in position to a core board are omitted herein since they are well known in the art and not relevant to the technical feature of the present invention. The follow-up fabrication processes are illustrated via the package structure in FIG. 2B'.

In FIG. 2C, a plurality of first via holes 230a and a plurality of second via holes 230b are formed in the first dielectric layer 23a and the second dielectric layer 23b, respectively, so as to expose the first electrode pads 211a and 211b and second electrode pads 212a and 212b, respectively. As shown in the drawing, a plurality of through holes 201 are formed in the core board 20, the first dielectric layer 23a, and the second dielectric layer 23b.

Figure 2D:
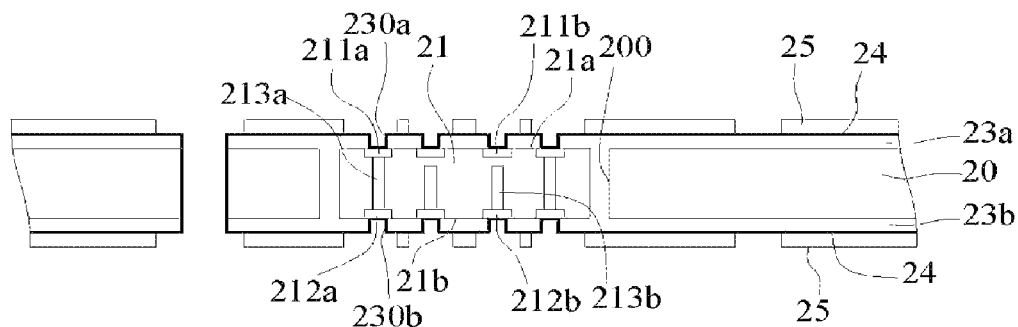

Referring to FIG. 2D, a conductive layer 24 is formed on the first dielectric layer 23a, walls of the first via holes 230a, the second dielectric layer 23b, walls of the second via holes 230b, walls of the through holes 201, the first electrode pads 211a and 211b, and the second electrode pads 212a and 212b. The conductive layer 24 is mainly used as a current conductive pathway required for the metal-electroplating process that will be discussed later. The conductive layer 24 is made of metal or alloy and can be a multi-deposited metallic layer, wherein the metal is copper, tin, nickel, chromium, titanium, or copper-chromium alloy. Afterward, a resist layer 25 is formed on the conductive layer 24 by printing, spin coating or laminating. Later, a plurality of open areas 250 are defined on the resist layer 25 by a patterning process including exposure and developing, so as to expose a portion of the conductive layer 24.

Figure 2E:
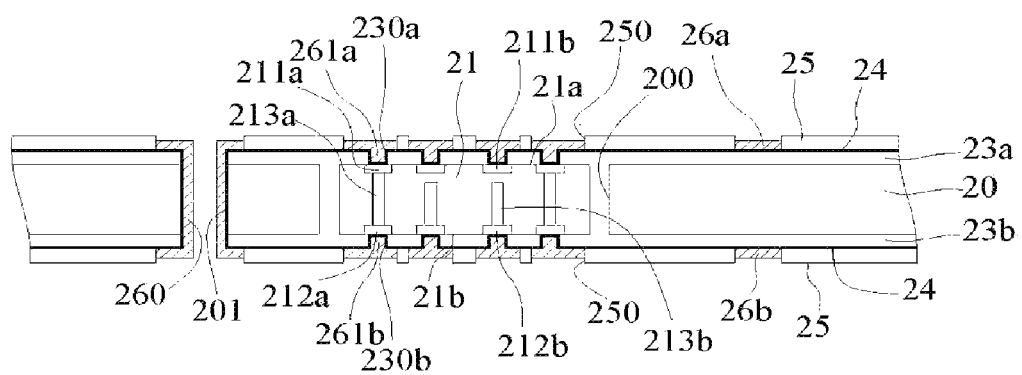

As shown in FIG. 2E, a first wiring layer 26a is formed on the conductive layer 24 exposed from the open areas 250 on the first dielectric layer 23a by electroplating, and a plurality of first conductive vias 261a are formed in the first via holes 230a of first dielectric layer 23a by electroplating so as to electrically connect with the first electrode pads 211a and 211b of the semiconductor chip 21. Also, a second wiring layer 26b is formed on the conductive layer 24 exposed from the open areas 250 on the second dielectric layer 23b and a plurality of second conductive vias 261b are formed in the second via holes 230b for electrically connecting the second electrode pads 212a and 212b of the semiconductor chip 21. Furthermore, a plurality of conductive through holes 260 are formed in the through hole 201 for electrically connecting the first wiring layer 26a and the second wiring layer 26b.

Figure 2F:
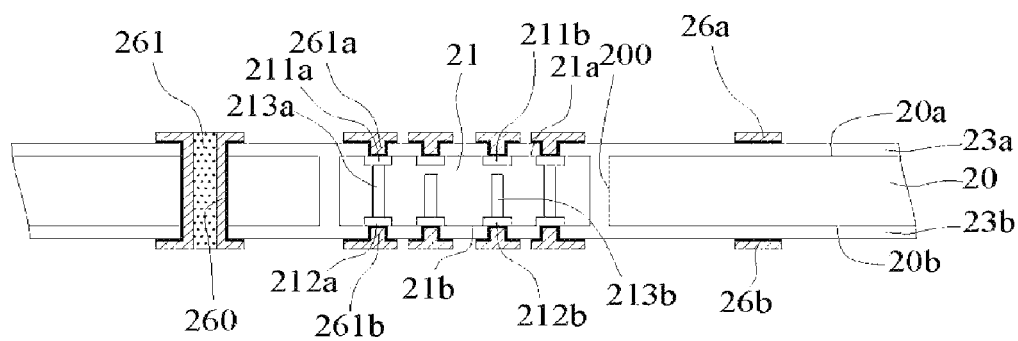

Referring to FIG. 2F, both the resist layer 25 and the conductive layer 24 thereunder are removed to expose the first wiring layer 26a and the second wiring layer 26b, and the conductive through hole 260 is filled with a hole-plugging material 261.

Figure 2G:
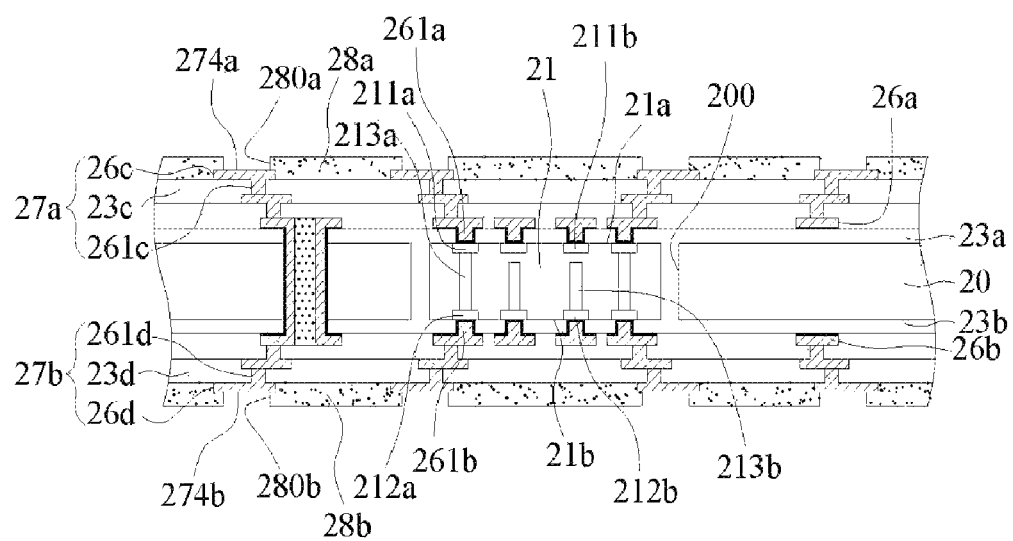

Referring to FIG. 2G, a first built-up structure 27a is formed on the first dielectric layer 23a and the first wiring layer 26a. The first built-up structure 27a comprises at least a third dielectric layer 23c, a third wiring layer 26c disposed on the third dielectric layer 23c, and a plurality of third conductive vias 261c formed in the third dielectric layer 23c for electrically connecting the first wiring layer 26a and the third wiring layer 26c, wherein the outermost third wiring layer 26c has a plurality of third conductive pads 274a. A first solder mask 28a is then formed on the first built-up structure 27a and formed with a plurality of first openings 280a for exposing the third conductive pads 274a, respectively.

A second built-up structure 27b is formed on the second dielectric layer 23b and the second wiring layer 26b. The second built-up structure 27b comprises at least a fourth dielectric layer 23d, a fourth wiring layer 26d formed on the fourth dielectric layer 23, and a plurality of fourth conductive vias 261d formed in the fourth dielectric layer for electrically connecting the second wiring layer 26b and the fourth wiring layer 26d. The outermost fourth wiring layer 26d has a plurality of fourth conductive pads 274b. A second solder mask 28b is then formed on the second built-up structure 27b and formed with a plurality of second openings 280b for exposing the fourth conductive pads 274b, respectively.

Referring to FIG. 2G, the present invention provides a package structure comprising a core board 20, a semiconductor chip 21, a first dielectric layer 26a, a first wiring layer 26a, a second dielectric layer 23b, and a second wiring layer 26b. The core board 20 has a first surface 20a, and an opposite second surface 20b, and a through cavity 200 penetrating the first surface 20a and the second surface 20b. The semiconductor chip 21 is received in the through cavity 200 and has an active surface 21a and an opposite inactive surface 21b. The active surface 21a and the inactive surface 21b have a plurality of first electrode pads 211a and 211b and a plurality of second electrode pads 212a and 212b provided thereon, respectively. The semiconductor chip 21 has a plurality of through-silicon vias 213a and 213b formed therein. A portion of the through-silicon vias 213a penetrate the semiconductor chip 21 for electrically connecting the first electrode pads 211a on the active surface 21a and the second electrode pads 212a on the inactive surface 21b. Another portion of the through-silicon vias 213b extend to the interior of the semiconductor 21 from the second electrode pads 212b of the inactive surface 21b for electrically connecting with the internal circuits of the semiconductor chip 21 (not shown). The first dielectric layer 26a is disposed on the first surface 20a of the core board 20 and the active surface 21a of the semiconductor chip 21. The first wiring layer 26a is disposed on the first dielectric layer 23a and formed with a plurality of first conductive vias 261a penetrating the first dielectric layer 23a so as for the first wiring layer 26a to be electrically connected to the first electrode pads 211a and 211b. The second dielectric layer 23b is disposed on the second surface 23b of the core board 20 and the inactive surface of the semiconductor chip 21. The second wiring layer 26b is disposed on the second dielectric layer 23b and formed with a plurality of second conductive vias 261b penetrating the second dielectric layer 23b so as for the second wiring layer 26b to be electrically connected to the second electrode pads 212a and 212b.

Therefore, the design of the package structure disclosed in the present invention is to electrically connect the first electrode pads 211a and 211b to the second electrode pads 212a and 212b by means of through-silicon vias 213a. As a result, in contrast to prior arts, the semiconductor chip 21 is electrically connected to the two sides of the package structure via the through-silicon vias 213a instead of the conductive through holes 260, so as to enhance electrical quality and prevent the inactive surface 21b of the chip 21 from occupying wiring layout space of the second surface 20b of the core board 20 to thereby increase wiring layout density and enhance electrical performance.

The package structure further comprises the conductive through holes 260 disposed in the core board 20, the first dielectric layer 23a and the second dielectric layer 23b for electrically connecting the first wiring layer 26a and second wiring layer 26b.

A first built-up structure 27a is formed on the first dielectric layer 23a and the first wiring layer 26a. The first built-up structure 27a comprises at least a third dielectric layer 23c, a third wiring layer 26c disposed on the third dielectric layer 23c, and a plurality of third conductive vias 261c formed in the third dielectric layer 23c for electrically connecting the first wiring layer 26a and the third wiring layer 26c. The outermost third wiring layer 26c has a plurality of third conductive pads 274a. A first solder mask 28a is disposed on the first built-up structure 27a and formed with a plurality of first openings 280a for exposing the third conductive pads 274a, respectively.

A second built-up structure 27b is formed on the second dielectric layer 23b and the second wiring layer 26b. The second built-up structure 27b comprises at least a fourth dielectric layer 23d, a fourth wiring layer 26d disposed on the fourth dielectric layer 23, and a plurality of fourth conductive vias 261d formed in the fourth dielectric layer for electrically connecting the second wiring layer 26b and the fourth wiring layer 26d. The outermost fourth wiring layer 26d has a plurality of fourth conductive pads 274b. A second solder mask 28b is disposed on the second built-up structure 27b and formed with a plurality of second openings 280b for exposing the fourth conductive pads 274b, respectively.

Figure 3A:
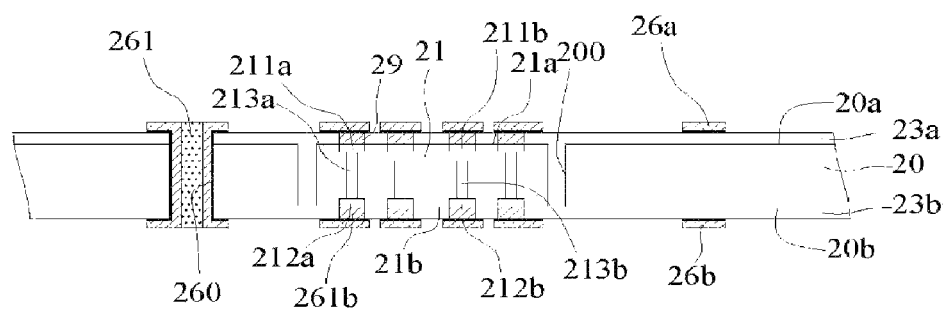
FIGS. 3A and 3B are cross-sectional diagrams showing a package structure according to an embodiment of the present invention.
Figure 3B:
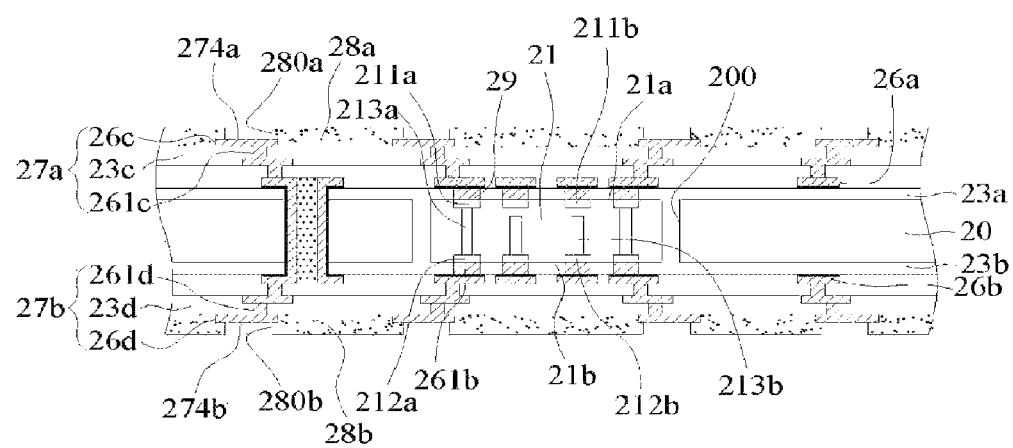

Referring to FIGS. 3A and 3B, which represent another embodiment of the package structure provided via the present invention, they only differ from FIGS. 2F and 2G in the electrical connection arrangement between electrode pads and wiring layers. In FIGS. 3A and 3B, there are no first conductive vias 261*a* and no second conductive vias 261*b* in the first and second wiring layers 26*a*, 26*b*; thus, the first electrode pads 211*a* and 211*b* and the second electrode pads 212*a* and 212*b* are electrically connected to the first wiring layer 26*a* and the second wiring layer 26*b* respectively by a plurality of bumps 29.

In brief, the purpose of the package structure disclosed in the present invention is to electrically connect the first electrode pads and the second electrode pads by means of through-silicon vias. As a result, in contrast to prior arts, the semiconductor chip of the present invention is electrically connected to the two sides of the package structure via the through-silicon vias instead of the conductive through holes, so as to enhance electrical quality and prevent the inactive surface 21*b* of the chip 21 from occupying wiring layout space of the second surface 20*b* of the core board 20 to thereby increase wiring layout density and enhance electrical performance.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined via the appended claims.

What is claimed is:

1. A package structure, comprising:
    a core board having a first surface, an opposite second surface, and at least a through cavity penetrating the first and second surfaces;
    a semiconductor chip received in the through cavity and having an active surface and an opposite inactive surface, the active surface and the inactive surface having a plurality of first electrode pads and a plurality of second electrode pads, respectively, wherein the semiconductor chip has a plurality of through-silicon vias, and a portion of the through-silicon vias penetrate the semiconductor chip for electrically connecting the first and second electrode pads, and only a portion of the through-silicon vias extend to an interior of the semiconductor chip;
    a first dielectric layer disposed on the first surface of the core board and the active surface of the semiconductor chip;
    a first wiring layer disposed on the first dielectric layer;
    a second dielectric layer disposed on the second surface of the core board and the inactive surface of the semiconductor chip;
    a second wiring layer disposed on the second dielectric layer; and
    a plurality of bumps disposed in the first and second dielectric layers so as for the first and second electrode pads to be electrically connected to the first and second wiring layers, respectively, via the bumps.

2. The package structure of claim 1, wherein the through-silicon vias electrically connect with the second electrode pads.

3. The package structure of claim 1, wherein the core board is a wireless substrate, a semi-finished resin layer, a circuit board having circuit traces, or an insulating board.

4. The package structure of claim 1, further comprising a plurality of conductive through holes formed in the core board, the first dielectric layer, and the second dielectric layer for electrically connecting the first and second wiring layers.

5. The package structure of claim 1, further comprising a first built-up structure provided on the first dielectric layer and the first wiring layer, the first built-up structure comprising at least a third dielectric layer, a third wiring layer disposed on the third dielectric layer, and a plurality of third conductive vias formed in the third dielectric layer for electrically connecting the first wiring layer and the third wiring layer, wherein the outermost third wiring layer has a plurality of third conductive pads.

6. The package structure of claim 5, further comprising a first solder mask disposed on the first built-up structure and formed with a plurality of first openings for exposing the third conductive pads, respectively.

7. The package structure of claim 1, further comprising a second built-up structure provided on the second dielectric layer and the second wiring layer, the second built-up structure comprising at least a fourth dielectric layer, a fourth wiring layer disposed on the fourth dielectric layer, and a plurality of fourth conductive vias formed in the fourth dielectric layer for electrically connecting the second wiring layer and the fourth wiring layer, wherein the outermost fourth wiring layer has a plurality of fourth conductive pads.

8. The package structure of claim 7, further comprising a second solder mask disposed on the second built-up structure and formed with a plurality of second openings for exposing the fourth conductive pads, respectively.

* * * * *